United States Patent
Tsuchida et al.

(10) Patent No.: US 9,883,586 B2
(45) Date of Patent: Jan. 30, 2018

(54) WIRING SUBSTRATE FOR BONDING USING SOLDER HAVING A LOW MELTING POINT AND METHOD FOR MANUFACTURING SAME

(71) Applicants: TOPPAN PRINTING CO. LTD., Tokyo (JP); NATIONAL UNIVERSITY CORPORATION GUNMA UNIVERSITY, Maebashi (JP)

(72) Inventors: Tetsuyuki Tsuchida, Tokyo (JP); Toshikazu Okubo, Tokyo (JP); Ikuo Shohji, Kiryu (JP); Akihiro Hirata, Kiryu (JP)

(73) Assignees: TOPPAN PRINTING CO., LTD., Tokyo (JP); NATIONAL UNIVERSITY CORPORATION GUNMA UNIVERSITY, Maebashi (JP)

( * ) Notice: Subject to any disclaimer, the term of this patent is extended or adjusted under 35 U.S.C. 154(b) by 0 days.

(21) Appl. No.: 14/808,275

(22) Filed: Jul. 24, 2015

(65) Prior Publication Data
US 2015/0334828 A1    Nov. 19, 2015

Related U.S. Application Data

(63) Continuation of application No. PCT/JP2014/051581, filed on Jan. 24, 2014.

(30) Foreign Application Priority Data

Jan. 28, 2013 (JP) ................................. 2013-013244

(51) Int. Cl.
*H05K 1/09*    (2006.01)
*H05K 3/10*    (2006.01)
(Continued)

(52) U.S. Cl.
CPC ............ *H05K 1/09* (2013.01); *B23K 1/0008* (2013.01); *B23K 1/008* (2013.01); *B23K 1/0016* (2013.01);
(Continued)

(58) Field of Classification Search
CPC . H05K 1/09; H05K 3/10; H05K 3/244; B23K 1/0008; B23K 1/0016
(Continued)

(56) References Cited

U.S. PATENT DOCUMENTS

2003/0121959 A1    7/2003    Yamaguchi et al.
2007/0111516 A1    5/2007    Abbott
(Continued)

FOREIGN PATENT DOCUMENTS

CN    1430465 A1    12/2002
CN    1998074 A1    7/2007
(Continued)

OTHER PUBLICATIONS

International Search Report dated Mar. 11, 2014 in corresponding international application PCT/JP2014/051581.
(Continued)

*Primary Examiner* — Tremesha S Willis

(57) ABSTRACT

There is provided a wiring substrate including an electrode including Cu or a Cu alloy, a plating film having a film including at least Pd, formed on the electrode, and a solder which is bonded onto the plating film by heating, has a melting point of lower than 140° C., and includes Pd dissolved therein, a Pd concentrated layer being absent between the solder and the electrode.

2 Claims, 3 Drawing Sheets

(51) Int. Cl.
*B23K 1/19* (2006.01)
*B23K 1/00* (2006.01)
*C25D 7/00* (2006.01)
*B23K 35/26* (2006.01)
*C22C 13/02* (2006.01)
*H05K 3/24* (2006.01)
*B23K 1/008* (2006.01)

(52) U.S. Cl.
CPC .............. *B23K 1/19* (2013.01); *B23K 35/262* (2013.01); *C22C 13/02* (2013.01); *C25D 7/00* (2013.01); *H05K 3/10* (2013.01); *H05K 3/244* (2013.01); *H01L 2924/0002* (2013.01); *H05K 2201/0341* (2013.01); *H05K 2203/043* (2013.01)

(58) Field of Classification Search
USPC ....... 174/257, 250, 251, 255, 256, 259, 261; 29/825, 829, 831, 846
See application file for complete search history.

(56) References Cited

U.S. PATENT DOCUMENTS

| | | | |
|---|---|---|---|
| 2011/0278624 A1* | 11/2011 | Nam ..................... | H01L 33/486 257/98 |
| 2013/0077275 A1* | 3/2013 | Kariyazaki ....... | H01L 23/49838 361/783 |
| 2013/0135834 A1* | 5/2013 | Horikawa ................ | H05K 1/11 361/760 |

FOREIGN PATENT DOCUMENTS

| | | |
|---|---|---|
| JP | 9-266373 | 10/1997 |
| JP | 10-41621 | 2/1998 |
| JP | 2001-077290 | 3/2001 |
| JP | 2003-174254 | 6/2003 |
| JP | 2006-122913 | 5/2006 |
| JP | 2006-339219 | 12/2006 |
| JP | 2007-063042 | 3/2007 |
| JP | 4822526 | 11/2011 |
| TW | 200850107 | 12/2008 |
| TW | 201107071 A1 | 3/2011 |

OTHER PUBLICATIONS

Sandy et al., "Advantages of Bismuth-based Alloys for Low Temperature Pb-Free Soldering and Rework From One Engineer to Another", Indium Corporation Tech Paper, Indium Corporation, Dec. 20, 2012, pp. 1-7.

Ferrer et al., "57Bi—42Sn—1Ag: A Lead Free, Low Temperature Solder for the Electronic Industry", Hewlett-Packard Company, Sep. 25, 2003, pp. 1-7.

Romm et al., "Evaluation of Nickel/Palladium-Finished ICs with Lead-Free Solder Alloys", Application Report SZZA024, Texas Instruments, Jan. 2001, pp. 1-17.

Extended European Search Report dated Aug. 31, 2016 in corresponding European Patent Application No. 14743400.5.

English translation of Chinese Office Action dated Mar. 13, 2017 in corresponding Chinese Patent Application No. 2014800058161.

Japanese Office Action dated Dec. 20, 2016 in corresponding Japanese Patent Application No. 2013-013244.

Translation of Japanese Office Action dated Dec. 20, 2016 in corresponding Japanese Patent Application No. 2013-013244 (Translation of Document AM of the Information Disclosure Statement filed on Mar. 20, 2017).

Taiwanese Office Action dated Oct. 17, 2017 in corresponding Taiwanese Patent Application No. 103102638.

* cited by examiner

WIRING SUBSTRATE FOR BONDING USING SOLDER HAVING A LOW MELTING POINT AND METHOD FOR MANUFACTURING SAME

CROSS REFERENCE TO RELATED APPLICATIONS

This application is a continuation application based on a PCT patent application Ser. No. PCT/JP2014/051581, filed Jan. 24, 2014, whose priority is claimed on Japanese Patent Application No. 2013-013244 filed Jan. 28, 2013, the entire contents of which are hereby incorporated by reference.

BACKGROUND OF THE INVENTION

Field of the Invention

The present invention relates to a wiring substrate, and more particularly to a wiring substrate onto which solder having a low melting point is bonded and a method for manufacturing the same.

Description of the Related Art

In a wiring substrate, such as a semiconductor chip mounting substrate provided with an electrode consisting of Cu or a Cu alloy and a printed wiring board, a multilayer wiring substrate using a build-up method is widely applied, in order to accommodate higher frequency, higher density wiring, and higher performance of a wiring substrate. Also, in order to realize a smaller, thinner, and lighter product, each electronics manufacturer attempts to deal with high density mounting, and as a result a package has had greater number of pins and narrower pitch. Particularly, the mounting on a printed wiring board has been developed from a conventional Quad Flat Package (QFP) towards Ball Grid Array (BGA)/ChiP Size Package (CSP), which is a type of an area surface mounting package.

Among those types of packaging techniques, the Flip Chip-Ball Grid Array (FC-BGA) technique, which mounts a semiconductor chip on a printed wiring board having an interposer therebetween and a Cu electrode formed on the printed wiring board and a Cu electrode formed on the interposer are electrically connected by a solder ball, draws attention due to low cost compared to a mounting technique by wire bonding using a Au wire.

Surface treatment is performed on the Cu electrodes that are formed on the interposer and the printed wiring board such that each of the Cu electrodes is connected with high reliability. Examples of surface treatment may include Ni/Au plating, onto which gold (Au) plating is performed on a surface of an electrode on which nickel (Ni) plating has been performed. Further, in recent years, since mounting reliability by a solder ball is good, Ni/Pd/Au plating, in which Ni plating, palladium (Pd) plating, and Au plating are performed sequentially in order, has been widely spread.

In addition, as a solder mounting material, solder including no lead (Pb) has been used instead of conventional Sn—Pb based solder that is subject to RoHS restrictions. Particularly, a Sn—Ag—Cu based solder such as Sn-3Ag-0.5Cu has been widely used. However, the use of a Sn—Ag—Cu based solder entails the following disadvantages such as that when a component with a low heat resistance is mounted, thermal degradation of the component occurs because of an increase in reflow temperature or that when the solder is bonded onto a thin substrate, the substrate becomes bent because of heat. Particularly, for using FC-BGA, reflow should be performed multiple times based on, for example, the number of substrates to be laminated, and these disadvantages further limit a mountable component and the thickness of substrate. In addition, an intermetallic compound layer formed in a bonding interface between a plating film and a solder that are formed on an electrode grows thick because of the rise in reflow temperature, and this results in degradation of impact resistance. Thus, it has been required to lower a mounting temperature.

In order to lower a mounting temperature, solder having a low melting point is used. Such solders may include Sn-58 wt % Bi and Sn-57 wt % Bi-1 wt % Ag solders. Sn-58 wt % Bi and Sn-57 wt % Bi-1 wt % Ag solders have a low melting point of 139° C. and a mounting temperature of approximately 170° C. even at the peak. Thus, using these solders may lower the mounting temperature by approximately 60° C. in comparison with other Sn—Ag—Cu based lead-free solders and by approximately 30° C. in comparison with Sn-37 wt % Pb solder.

Sn-58 wt % Bi and Sn-57 wt % Bi-1 wt % Ag, however, are not widely used because of their hard and brittle properties that degrade impact resistance. However, there is an example of improving the ductility of solder by using Sn-57 wt % Bi-0.5 wt % Sb solder where Sb is added to Sn—Bi.

As described above, as the need for a solder with a low melting point increases, high reliability of solder mounting between the solder with a low melting point and a plating film is required. Particularly, for using FC-BGA, and the like, a reflow resistance that allows retaining high reliability of solder mounting even after many times of reflow is required.

Suggested is a joined body obtained by forming a thin film including at least one of Pd and Ni on Cu, bonding a solder thereon, and then removing the thin film (for example, Japanese Patent No. 4822526).

However, the solder includes 80 wt % to 100 wt % of Bi and has a bonding temperature of 270° C. or higher, and thus it is difficult to be used for components with low heat resistance.

The present invention takes into consideration of the above circumstances and provides a wiring substance capable of achieving highly reliable solder mounting even when a solder having a melting point of lower than 140° C. is used and provides a method for manufacturing the same.

SUMMARY OF THE INVENTION

According to a first aspect of the present invention, there is provided a wiring substrate including an electrode including Cu or a Cu alloy, a plating film formed on the electrode and including a film including at least Pd, and a solder bonded onto the plating film by heating, having a melting point of lower than 140° C., and including Pd dissolved therein, in which a Pd concentration layer is absent between the solder and the electrode.

According to a second aspect of the present invention, in the first aspect, the solder may include at least Sn, Bi, or Sb.

According to a third aspect of the present invention, a method is provided for manufacturing a wiring substrate including forming a plating film including a film including at least Pd on an electrode including Cu or a Cu alloy, and bonding solder having a melting point lower than 140° C. onto the plating film by heating to dissolve the Pd in the solder.

According to a fourth aspect of the present invention, in the third aspect, the solder is bonded onto the plating film by heating under a predetermined thermal condition that may be one of the following that (1) reflow treatment at the time of bonding the solder is performed under a condition where a peak temperature is 139° C. or higher and the time of maintaining the temperature at 139° C. or higher is less than 90 seconds, and the reflow treatment is performed at least once under the same condition, (2) after bonding the solder, heating treatment of maintaining the temperature at 139° C. or higher for 90 seconds or longer is performed, and (3) the bonding of solder is performed under a condition where reflow treatment performed in which a peak temperature is 139° C. or higher and the time of maintaining the temperature at 139° C. or higher is 90 seconds or longer, is performed at least once.

According to a fifth aspect of the present invention, in the third or fourth aspect, when the plating film is formed, the thickness of the film including Pd may be 0.01 μm or more and 5 μm or less.

According to a wiring substrate and method for manufacturing the same of the present invention, high reliability of solder mounting can be achieved even when a solder having a melting point lower than 140° C. is used.

DETAILED DESCRIPTION OF THE PREFERRED EMBODIMENTS

Basic Structure of Wiring Substrate

Figure 1:
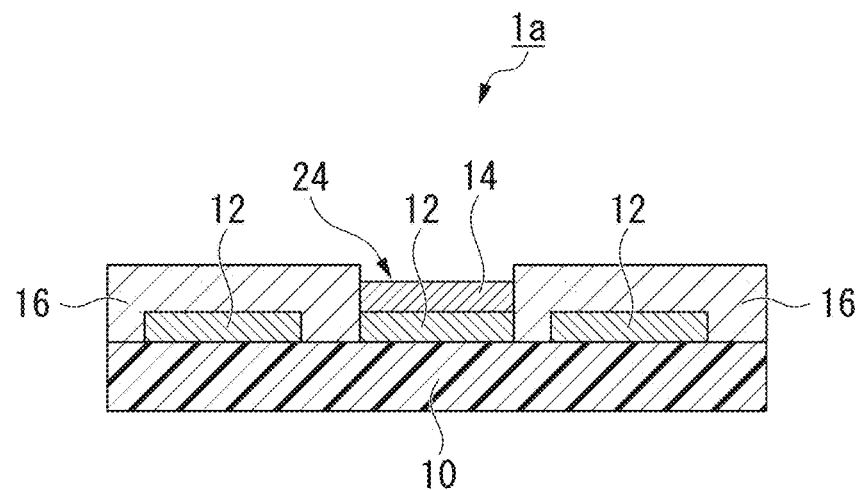
FIG. 1 is a sectional view of a pre-substrate used for the manufacture of a wiring substrate that is related to an exemplary embodiment of the present invention.

A wiring substrate of the present exemplary embodiment is suitable for bonding using solder with a low melting point and is manufactured using a pre-substrate provided with an electrode including Cu or a Cu alloy and a plating film formed on the electrode. The plating film, which has various aspects, may be any one of a multilayer film provided with a Ni plating film, a Pd plating film and a Au plating film, a multilayer film provided with a Pd plating film and a Au plating film, a multilayer film provided with a Ni plating film and a Pd plating film, and a single layer film provided with a Pd plating film.

Also, in the wiring substrate of the present exemplary embodiment, solder (for example, solder layer) including at least Sn and Bi is bonded onto the electrode having the plating film, with a melting point of lower than 140° C. Here, the thickness of the Pd plating film to be stacked and the reflow condition are controlled so as to not form a Pd concentrated layer, which will be described later, between the electrode and the solder, caused by reflow treatment during solder bonding and another heating treatment after thermal bonding by reflow treatment.

Particularly, according to the wiring substrate of the present exemplary embodiment, it is controlled not to form a Pd concentrated layer between the electrode and the solder by any one of the following (1) to (3). (1) Reflow treatment at the time of bonding the solder is performed under a condition where the peak temperature is 139° C. or higher and the time of maintaining the temperature at 139° C. or higher is less than 90 seconds, and the reflow treatment is performed at least once under the same condition. (2) In (1), after bonding the solder, heating treatment of maintaining the temperature at 139° C. or higher for 90 seconds or longer is performed. (3) Reflow treatment at the time of bonding the solder is performed at least once under a condition where a peak temperature is 139° C. or higher and the time of maintaining the temperature at 139° C. or higher is 90 seconds or longer.

The term "Pd concentrated layer" refers to a layer-shaped aggregate of Pd remaining on the interface between a plating film and an intermetallic compound layer formed by solder bonding, because not all Pd is dissolved in a solder when the solder is bonded onto a single layer plating film or a multilayer plating film including a Pd plating film. When a Pd concentrated layer is formed between an electrode and a solder, the Pd concentrated layer may become a cracking point upon impact, and this may degrade reliability of mounting.

The present application provides a thermal condition where the Pd concentrated layer is not formed in a solder bonding process. Particularly, reflow treatment is performed at least once under a condition where a peak temperature is 139° C. or higher and the time of maintaining the temperature at 139° C. or higher is less than 90 seconds. Alternatively, Pd in the plating film is uniformly dissolved in a solder bulk and is removed by heating treatment where the time of maintaining the temperature at 139° C. or higher is 90 seconds or longer, performed after solder bonding. Alternatively, if the reflow treatment during solder bonding is performed under a condition where a peak temperature is 139° C. or higher and the time of maintaining the temperature at 139° C. or higher is 90 seconds or longer, Pd in the plating film may be uniformly dissolved in a solder bulk even by one reflow, so that no Pd concentrated layer may be formed.

No formation of a Pd concentrated layer allows stable bonding between an electrode and a solder, and this improves reliability of solder mounting.

Hereinafter, one example of the wiring substrate of the present exemplary embodiment will be described in detail.

FIG. 1 is a sectional view of a pre-substrate 1a used for the manufacture of a wiring substrate of the present exemplary embodiment. The pre-substrate 1a is a substrate for electroless plating.

The pre-substrate 1a, as illustrated in FIG. 1, includes an insulating resin substrate 10, an electrode 12 formed on the insulating resin substrate 10, a plating film 14 formed on the electrode 12, and a solder resist layer 16 protecting the electrode 12.

Figure 2:
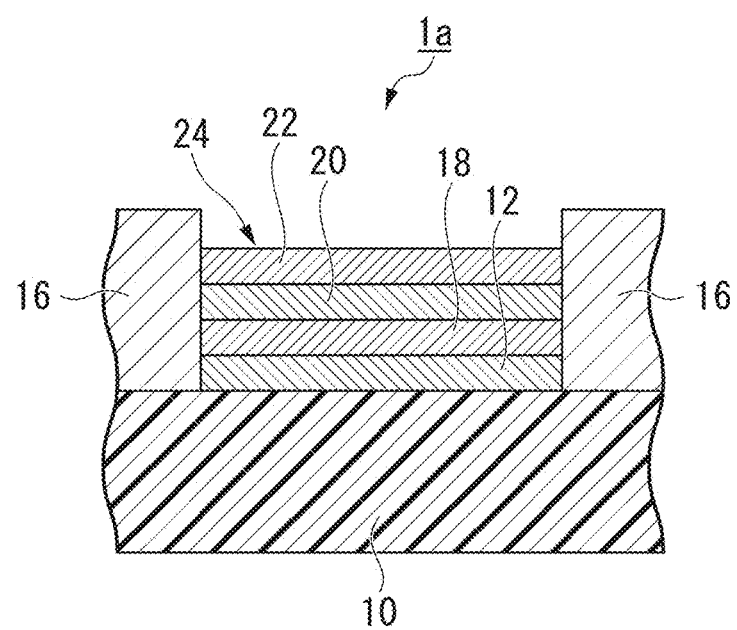
FIG. 2 is an enlarged view of the main part of FIG. 1.

The plating film 14 is formed on the surface of a pad 24 that is a solder bonding site in the electrode 12. In the present exemplary embodiment, as illustrated in FIG. 2, the plating film 14 is a multilayer film which includes a Ni plating film 18, a Pd plating film 20, and a Au plating film 22 layered on the electrode 12. As described above, the plating film may have various aspects. For example, when constituting the plating film with two layers of a Pd plating film and a Au plating film, the Pd plating film 20 and the Au plating film 22 are layered on the electrode 12. When constituting the plating film with only a single layer of a Pd plating film, only the Pd plating film 20 is formed on the electrode 12. In any case, in the present exemplary embodiment, the plating film 14 is configured to include the Pd plating film 20.

Figure 3:
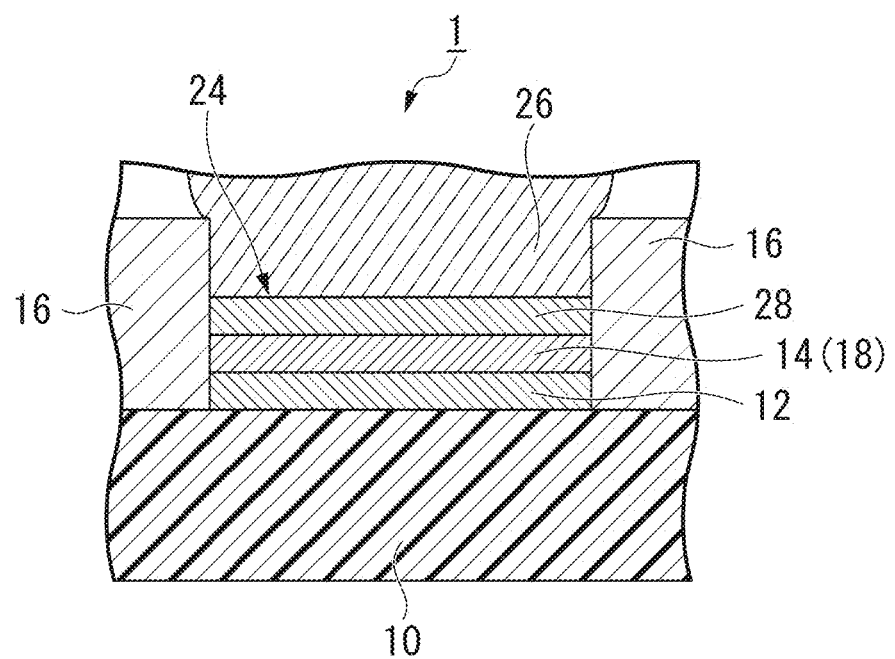
FIG. 3 is a sectional view of the periphery of the plating film in the wiring substrate of FIG. 1 where the solder is mounted on the pre-substrate.

When solder 26 (see FIG. 3) is bonded by heating, which will be described later, onto the plating film 14 in the pre-substrate 1a, the Pd plating film 20 and the Au plating film 22 are dissolved in the solder 26. On the bonding interface between the Ni plating film 18 and the solder 26, an intermetallic compound layer 28 is formed as illustrated in FIG. 3.

Examples of an insulating resin constituting the insulating resin substrate 10 may include a glass epoxy resin, a paper epoxy resin, a paper phenol resin, a polyimide film, a polyester film, and the like.

The electrode 12 includes Cu or a Cu alloy. Examples of the Cu alloy that forms a predetermined electric circuit may include an alloy of Cu with Zn, Ni, Sn, Fe, Cr, Mg, Si, P, and the like.

The electrode 12 may be formed by a known process such as subtractive process, semi additive process, additive process, and the like.

Further, the portion of the electrode 12 out of the pad 24 that is the solder bonding site is protected by the solder resist layer 16. The solder resist layer 16 may be formed by a known process such as screen printing process, photolithography process, and the like.

In addition, in the case of a wiring substrate for an electrolytic plating process, an electrode under an insulating resin layer is not independent and is configured to be conductive.

For the Ni plating film 18, either an electroless plating film or an electrolytic plating film may be used. For an electroless Ni plating film, any one in which the eutectoid substance of the plating film includes Pb, S and P; Bi, S and P; or S and P may be used. The electroless Ni plating film including Bi, S and P may be formed using a lead-free electroless Ni plating bath, and the electroless Ni plating film including S and P may be formed using a heavy metal free Ni electroless plating bath. Its eutectoid substances are not limited to Pb, Bi, S, and P, but may include B, C, and H, or any one of Pb, Bi, S, P, B, C, and H. The concentration of each component in the film is not particularly defined.

For an electrolytic Ni plating film, any one of a non-bright plating film, a semi-bright plating film, and a bright plating film may be used. The plating film may be formed using any one of a Watt bath, Weisberg nickel plating bath, black coloring nickel plating bath, strike nickel plating bath, and nickel sulphamate plating bath, as a base.

The thickness of the Ni plating film 18 is preferably 0.5 μm or greater, more preferably 3 μm to 5 μm.

As long as the thickness of the Ni plating film 18 is the lower limit or greater, the thickness of the plating film 14 to be formed tends to be more uniform. Thereby, the thickness of the intermetallic compound layer 28 that is formed on the bonding interface between the plating film and the solder tends to be more uniform, and impact resistance is improved. Setting the thickness of the Ni plating film to 3 μm to 5 μm may achieve a greater effect. Further, setting the thickness of the Ni plating film 18 to 5 μm or thinner may shorten the plating time.

For the Pd plating film 20, either an electroless plating film or an electrolytic plating film may be used. For an electroless Pd plating film, for example, either a known electroless Pd—P plating film or an electroless pure Pd plating film may be used, and for example, other elements than P may be included therein.

For an electrolytic Pd plating film, any one of a non-bright plating film, a semi-bright plating film, and a bright plating film may be used, and Pd—Ni, Pd—Co, Pd—Cu and Pd—In plating films that are formed with metals different from the eutectoid may be used.

The thickness of the Pd plating film 20 is preferably 0.01 μm or greater and 5 μm or less, more preferably 0.05 μm or greater and 1 μm or less. When the thickness of the Pd plating film is less than 0.01 μm, a Ni/Pd/Au plating film is formed on an electrode including Cu, and by reflow, solder having a melting point lower than 140° C. and configured to include at least Sn and Bi is bonded by heating under a reflow condition such that the temperature of 139° C. or higher lasts shorter than 90 seconds. In this case, when the Pd plating film is completely dissolved in the solder during the heat bonding process, a large amount of Ni under the Pd plating film is brought into dissolution reaction because the Pd plating film is thin. Here, when the Ni plating film is, for example, an electroless Ni plating film constituted with P as eutectoid, a P-rich layer is formed on the bonding interface between the Ni plating film and the solder, and this degrades reliability of mounting. Thus, this case is not preferable.

On the other hand, when the thickness of the Pd plating film 20 is greater than 5 μm, an excessive thermal condition may be required in order to prevent the presence of a Pd concentrated layer.

For the Au plating film 22, either an electroless plating film or an electrolytic plating film may be used. For an electroless Au plating film, a plating film formed by a process, such as displacement Au plating, displacement reduction Au plating, and reduction Au plating, may be used.

For an electrolytic Au plating film, any one of a non-bright plating film, a semi-bright plating film, and a bright plating film may be used.

The thickness of the Au plating film 22 is preferably 0.5 μm or less, more preferably 0.05 μm or less, in order to obtain sufficient solderability. As long as the thickness of the Au plating film 22 is the upper limit or less, segregation of the intermetallic compound on the bonding interface between the plating film 14 and the solder 26 may be readily inhibited, and reliability of solder mounting may be improved.

When the plating film 14 is a multilayer film including a plurality of layers, there is no specific limitation on a method of forming each layer. In other words, in the plating film, all of the layers may be either an electrolytic plating film or an electroless plating film, or the layers may include an electrolytic plating film and an electroless plating film.

When the solder 26 is bonded onto the plating film 14 of the pre-substrate 1a under a predetermined thermal condition, a wiring substrate 1 of the present exemplary embodiment is obtained.

The solder 26 of the present exemplary embodiment has a melting point of lower than 140° C., and includes at least Sn and Bi. Examples of the solder may include Sn-58 wt % Bi, Sn-57 wt % Bi-1 wt % Ag, Sn-57 wt % Bi-0.5 wt % Sb, and the like.

Thermal condition when the solder 26 is bonded will be described. First, a peak temperature in the reflow condition is maintained to be 139° C. or higher. The time of maintaining the temperature at 139° C. or higher is set to 90 seconds or longer in the case of the thickness of the Pd plating film 18 being 0.1 μm or greater and no Pd concentrated layer is generated between the electrode 12 and the solder 26 in one reflow. In the case that a Pd concentrated layer is removed by heating treatment performed after thermal bonding in one reflow, the time of maintaining the temperature at 139° C. or higher in the reflow is set to shorter than 90 seconds.

When the thickness of the Pd plating film 18 is less than 0.1 μm, it is possible to prevent a Pd concentrated layer from being generated even in one reflow where the time of maintaining the temperature at 139° C. or higher is shorter than 90 seconds.

For example, when the solder 26 is bonded onto a Ni/Pd/Au plating film or a Ni/Pd plating film by heating, an intermetallic compound layer such as $(Cu, Ni)_3Sn_4$ and $Ni_3Sn_4$ is formed between the electrode and the solder. When the solder 26 is bonded onto a Pd/Au plating film or a Pd plating film by heating, an intermetallic compound layer consisting of $Cu_6Sn_5$ and $Cu_3Sn$ is formed on the electrode and the solder.

Pd and Au are dissolved in the solder 26 when the solder 26 is bonded by heating. The Pd plating film 20 has a slower dissolving rate than the Au plating film 22 in the solder. Thus, for example, when the solder is bonded onto the Pd plating film 20 having the thickness of 0.1 μm in one reflow performed under a reflow condition where a peak temperature is 139° C. or higher, and the time of maintaining the temperature at 139° C. or higher is shorter than 90 seconds, a Pd concentrated layer is formed on the bonding interface between the plating film 14 and the solder 26, and thus reliability of solder mounting deteriorates. However, when the solder is bonded in one reflow performed under a reflow condition where a peak temperature is 139° C. or higher, and the time of maintaining the temperature at 139° C. or higher is 90 seconds or longer, no Pd concentrated layer is formed between the electrode 12 and the solder 26, and thus reliability of solder mounting improves.

However, when the solder is bonded in one reflow under a reflow condition where a peak temperature is 139° C. or higher, and the time of maintaining the temperature at 139° C. or higher is shorter than 90 seconds, a Pd concentrated layer may be formed between the electrode 12 and the solder 26. In such a case, Pd may be completely dissolved in the solder 26 to remove the Pd layer, by performing repeated reflow or performing heating treatment after bonding at a temperature at 139° C. or higher for 90 seconds or longer. Then, an intermetallic compound layer is uniformly formed on the bonding interface between the plating film 14 and the solder 26, which allows stable bonding, and this improves reliability of solder mounting.

For the above reasons, the present exemplary embodiment can be applied to a substrate, for example, such as FC-BGA, requiring repeated reflow, and after repeated reflow, an intermetallic compound layer is uniformly formed between the electrode and the solder, thereby allowing stable bonding. As a result, the present exemplary embodiment can provide a wiring substrate having high reliability of solder mounting.

Also, from a view point of preventing the solder from hardening in the finished wiring substrate, the total number of reflows is preferably 5 times or less (for example, the number of repetition is 4 times or less), and the total time of heating treatment including reflow is preferably 300 seconds or shorter.

Method for Manufacturing Wiring Substrate

Hereinafter, a method for manufacturing the wiring substrate 1 of the present exemplary embodiment will be described by referring to FIGS. 1 to 3.

The present manufacturing method includes a plating film forming process of forming the plating film 14 on the electrode 12 and a solder bonding process of bonding the solder 26 under a predetermined thermal condition on the plating film.

(Process of Forming Plating Film)

The manufacturing method of the present exemplary embodiment includes the following three processes because the plating film 14 is a three-layered structure.

Process of Ni plating: process of forming the Ni plating film 18 on the electrode 12 by electroless Ni plating or electrolytic Ni plating Process of Pd plating: process of forming the Pd plating film 20 on the Ni plating film 18 by electroless Pd plating or electrolytic Pd plating Process of Au plating: process of forming the Au plating film 22 on the Pd plating film 20 by electroless Au plating or electrolytic Au plating The plating film 14 is formed on the electrode 12 according to the above processes. Further, it is apparent that the details of the present process can be appropriately changed by the specific constitution of the plating film.

(Process of Solder Bonding)

In the process of solder bonding, a solder including at least Sn and Bi, with a melting point of lower than 140° C., described above, is bonded onto the plating film that is on the electrode 12.

By performing the process of solder bonding under the above-described thermal condition, a Pb concentrated layer is not formed from the beginning or is removed after once the Pb concentrated layer has been formed, and thus the Pb concentrated layer is not recognized in the manufactured wiring substrate 1. The intermetallic compound layer 28 is formed on the bonding interface between the plating film 14 and the solder 26.

Hereinafter, each plating process in the process of forming the plating film will be described.

(Process of Ni Plating)

The Ni plating film to be formed may be, but is not specifically limited to, an electroless Ni plating film including Pb in the plating film, a lead-free electroless Ni plating film including Bi and S, and a heavy metal free electroless Ni plating film including S. Here, in the electroless Ni plating film including Pb, the lead-free electroless Ni plating film, the heavy metal free electroless Ni plating film, each electroless Ni plating film 18 may be formed on the electrode 12 by adding a Pd catalyst to the surface of the electrode 12 on the insulating resin surface 10 and immersing each into an electroless Ni plating bath. In the case of electrolytic Ni plating, an electrolytic Ni plating film that is conductive to a substrate to be plated may be formed.

(Process of Pd Plating)

The Pd plating film to be formed may be, but is not specifically limited to, an electroless Pd phosphorus plating film, an electroless pure Pd plating film, an electrolytic Pd plating film, and the like. Here, in the electroless Pd phosphorus plating film and the electroless pure Pd plating film, the electroless Pd plating film 20 may be formed on the electroless Ni plating film 18 by forming the electroless Ni plating film 18 on the surface of the electrode 12 that is on the insulating resin substrate 10 and immersing it into an electroless Pd plating bath. In the case of electrolytic Pd plating film, an electrolytic Pd plating film that is conductive to a substrate to be plated may be formed. Further, either the electroless Pd plating or the electrolytic Pd plating may be formed directly on Cu or a Cu alloy.

(Process of Au Plating)

The Au plating film to be formed may be, but is not specifically limited to, a displacement Au plating film, a displacement reduction Au plating film, a reduction Au plating film, an electrolytic Au plating film, and the like. Here, in the displacement Au plating film, the displacement reduction Au plating film, and the reduction Au plating film, the electroless Au plating film 22 may be formed on the electroless Pd plating film 20 by layering the electroless Ni plating film 18 and the electroless Pd plating film 20 in order on the surface of the electrode 12 that is on the insulating resin substrate 10, and immersing it into an electroless Au plating bath. In the case of electrolytic Au plating, an electrolytic Au plating film that is conductive to a substrate to be plated may be formed.

Hereinafter, Examples of various aspects of the process of solder bonding are provided.

Example 1: A flux is applied on the plating film 14 that is formed on the electrode 12, a solder ball constituted with the solder 26 is mounted thereon, and the thermal bonding is performed under a reflow condition where a peak temperature is 139° C. or higher, and the time of maintaining the temperature at 139° C. or higher is shorter than 90 seconds.

Example 2: A solder paste of the solder 26 is printed on the plating film 14, and the thermal bonding is performed under the above-described reflow condition.

According to these processes, a wiring substrate where a Pd concentrated layer is formed on the bonding interface between the plating film 14 and the solder can be obtained.

Thereafter, the Pd concentrated layer is removed by repeated reflow under the same condition, and thereby the wiring substrate 1 of the present exemplary embodiment is completed.

In another aspect, only one reflow may be performed under a condition where a peak temperature is 139° C. or higher, and the time of maintaining the temperature at 139° C. or higher is 90 seconds or longer, instead of the above-described reflow condition. By doing this, Pd is completely dissolved in a solder bulk, and thus no Pd concentrated layer is generated.

In yet another aspect, after the solder 26 is bonded, the Pd concentrated layer may be removed by performing heating treatment where the time of maintaining the temperature at 139° C. or higher is 90 seconds or longer.

In the thus-formed wiring substrate 1, dissolved Pd is included in the solder 26, and thus no Pd concentrated layer is present between the solder 26 and the electrode 12.

As described above, according to the wiring substrate and the method for manufacturing the wiring substrate of the present exemplary embodiment, the thickness of the Pd plating film in the plating film 14 is set to a predetermined range, and the thermal condition when the solder 26 is bonded is provided as described above. As a result, a structure where no Pd concentrated layer is present by dissolving Pd in a solder bulk, while using the solder having a low melting point, can be obtained, and a wiring substrate with high reliability of bonding can be provided.

Also, as the thermal condition is relatively low temperature, the wiring substrate can be properly manufactured even with a material having not so high thermal resistance.

EXAMPLES

Next, the wiring substrate of the present exemplary embodiment and its manufacturing method are further described with Examples and Comparative Examples. The following description is used to provide examples only, and the present invention is not limited by the following description.

First, a basic substrate that is used for the manufacture of a pre-substrate is described.

(Manufacture of Basic Substrate)

Electrolytic Cu plating was performed on a copper coated laminate that is made of a glass epoxy resin, having the thickness of 0.8 mm, and the portion out of a pad (having a diameter of 300 μm) is coated with a solder resist (product name: AUS308, manufactured by TAIYO INK MFG. CO., LTD.), to obtain a basic substrate having an electrode 12 consisting of Cu.

(Pre-Substrate 1)

The Ni plating film 18 having the thickness of 3 μm was formed on the electrode 12 of the above-mentioned basic substrate, using an electroless Ni plating bath (bath temperature: 81° C.) in which sulfuric acid Ni (20 g/L), sodium hypophosphite (20 g/L) as a reducing agent, lactic acid (30 g/L) as a complexing agent, lead nitrate as a lead salt, and thiourea as a sulfur-based compound were dissolved in water.

Then, the Pd plating film 20 having the thickness of 0.1 μm was formed on the Ni plating film 18, using an electroless Pd plating bath (bath temperature: 43° C.) including Tetraammine Pd (0.8 g/L as Pd), sodium hypophosphite (10 g/L), bismuth nitrate (2 mg/L), and phosphoric acid (10 g/L).

Thereafter, the Au plating film 22 having the thickness of 0.05 μm was formed on the Pd plating film 20, using an electroless Au plating bath (bath temperature: 86° C.) including potassium Au cyanide (1.0 g/L as Au), thiosulfuric acid (1 mg/L), citric acid (25 g/L), and phosphoric acid (10 g/L). Thereby, the plating film 14 in which the electroless Ni plating film/electroless Pd plating film/electroless Au plating film were layered was formed on the electrode 12.

(Pre-Substrate 2)

The lead-free Ni plating film 18 having the thickness of 3 μm was formed on the electrode 12 of the basic substrate, using an electroless Ni plating bath (bath temperature: 81° C.) in which sulfuric acid Ni (20 g/L), sodium hypophosphite (20 g/L) as a reducing agent, lactic acid (30 g/L) as a complexing agent, bismuth nitrate as a bismuth salt, and thiourea as a sulfur-based compound were dissolved in water.

Then, the Pd plating film 20 having the thickness of 0.1 μm was formed on the Ni plating film 18, using an electroless Pd plating bath (bath temperature: 43° C.) including Tetraammine Pd (0.8 g/L as Pd), sodium hypophosphite (10 g/L), bismuth nitrate (2 mg/L), and phosphoric acid (10 g/L).

Thereafter, the Au plating film 22 having the thickness of 0.05 μm was formed on the Pd plating film 20, using an electroless Au plating bath (bath temperature: 86° C.) including potassium Au cyanide (1.0 g/L as Au), thiosulfuric acid (I mg/L), citric acid (25 g/L), and phosphoric acid (10 g/L). Thereby, the plating film 14 in which the lead-free electroless Ni plating film/electroless Pd plating film/electroless Au plating film were layered was formed on the electrode 12.

(Pre-Substrate 3)

The lead-free Ni plating film having the thickness of 3 μm was formed on the electrode 12 of the basic substrate, using an electroless Ni plating bath (bath temperature: 81° C.) in which sulfuric acid Ni (20 g/L), sodium hypophosphite (20 g/L) as a reducing agent, lactic acid (30 g/L) as a complexing agent, bismuth nitrate as a bismuth salt, and thiourea as a sulfur-based compound were dissolved in water.

Thereafter, the Au plating film having the thickness of 0.05 μm was formed on the Ni plating film, using an electroless Au plating bath (bath temperature: 86° C.) including potassium Au cyanide (1.0 g/L as Au), thiosulfuric acid (1 mg/L), citric acid (25 g/L), and phosphoric acid (10 g/L). Thereby, the plating film in which the lead-free electroless Ni plating film/electroless Au plating film were layered was formed on the electrode 12.

(Pre-Substrate 4)

The Pd plating film 20 having the thickness of 2.7 μm was formed on the electrode 12 of the basic substrate, using an electroless Pd plating bath (bath temperature: 43° C.) including Tetraammine Pd (0.8 g/L as Pd), sodium hypophosphite (10 g/L), bismuth nitrate (2 mg/L), and phosphoric acid (10 g/L).

Thereafter, the Au plating film 22 having the thickness of 0.06 μm was formed on the Pd plating film 20, using an electroless Au plating bath (bath temperature: 86° C.) including potassium Au cyanide (1.0 g/L as Au), thiosulfuric acid (1 mg/L), citric acid (25 g/L), and phosphoric acid (10 g/L). Thereby, the plating film 14 in which the electroless Pd plating film/electroless Au plating film were layered was formed on the electrode 12.

(Pre-Substrate 5)

The Pd plating film having the thickness of 2.7 μm was formed on the electrode 12 of the basic substrate, using an electroless Pd plating bath (bath temperature: 43° C.) including Tetraammine Pd (0.8 g/L as Pd), sodium hypophosphite (10 g/L), bismuth nitrate (2 mg/L), and phosphoric acid (10 g/L). Thereby, the plating film 14 with the single-layer electroless Pd plating film was formed on the electrode 12.

(Pre-Substrate 6)

The plating film 14 of a multilayer structure was formed on the electrode 12 of the basic substrate such that the thickness of the Ni plating film 18 is 4.4 μm, the thickness of the Pd plating film 20 is 0.33 μm, and the thickness of the Au plating film 22 is 0.07 μm, using a Ni sulfamate plating bath (bath temperature: 50° C.) including Ni sulfamate (600 g/L), Ni chloride (5 g/L), and boric acid (40 g/L), a commercialized Pd plating bath (bath temperature: 25° C.), and a bright Au plating bath (bath temperature: 60° C.) including cyanide Au potassium (10 g/L), potassium monohydrogen phosphate (45 g/L), and a chelating agent (45 g/L).

Example 1

A solder ball made of Sn-58 wt % Bi, with a diameter of 350 μm, was mounted on the plating film 14 of the above-described pre-substrate 1, and reflow was preformed five times under a condition where a peak temperature was 169° C. and the time of maintaining the temperature at 139° C. or higher was 60 seconds. Thereby, a wiring substrate of Example 1 was obtained. 10 specimens of Example 1 were manufactured.

Comparative Example 1

A solder ball made of Sn-58 wt % Bi, with a diameter of 350 μm, was mounted on the plating film 14 of the pre-substrate 1, and reflow was preformed once under a condition where a peak temperature was 169° C. and the time of maintaining the temperature at 139° C. or higher was 60 seconds. Thereby, a wiring substrate of Comparative Example 1 was obtained. Ten specimens of Comparative Example 1 were manufactured.

Example 2

A solder ball made of Sn-57 wt % Bi-0.5 wt % Sb, with a diameter of 350 μm, was mounted on the plating film 14 of the pre-substrate 1, and reflow was preformed five times under a condition where a peak temperature was 169° C. and the time of maintaining the temperature at 139° C. or higher was 60 seconds. Thereby, a wiring substrate of Example 2 was obtained. Ten specimens of Example 2 were manufactured.

Comparative Example 2

A solder ball made of Sn-57 wt % Bi-0.5 wt % Sb, with a diameter of 350 μm, was mounted on the plating film 14 of the pre-substrate 1, and reflow was preformed once under a condition where a peak temperature was 169° C. and the time of maintaining the temperature at 139° C. or higher was 60 seconds. Thereby, a wiring substrate of Comparative Example 2 was obtained. 10 specimens of Comparative Example 2 were manufactured.

Example 3

A solder ball made of Sn-58 wt % Bi, with a diameter of 350 μm, was mounted on the plating film 14 of the pre-substrate 2, and reflow was preformed five times under a condition where a peak temperature was 169° C. and the time of maintaining the temperature at 139° C. or higher was 60 seconds. Thereby, a wiring substrate of Example 3 was obtained. Ten specimens of Example 3 were manufactured.

Comparative Example 3

A solder ball made of Sn-58 wt % Bi, with a diameter of 350 μm, was mounted on the plating film 14 of the pre-substrate 2, and reflow was preformed once under a condition where a peak temperature was 169° C. and the time of maintaining the temperature at 139° C. or higher was 60 seconds. Thereby, a wiring substrate of Comparative Example 3 was obtained. Ten specimens of Comparative Example 3 were manufactured.

Example 4

A solder ball made of Sn-57 wt % Bi-0.5 wt % Sb, with a diameter of 350 μm, was mounted on the plating film 14 of the pre-substrate 2, and reflow was preformed five times under a condition where a peak temperature was 169° C. and the time of maintaining the temperature at 139° C. or higher was 60 seconds. Thereby, a wiring substrate of Example 4 was obtained. Ten specimens of Example 4 were manufactured.

Comparative Example 4

A solder ball made of Sn-57 wt % Bi-0.5 wt % Sb, with a diameter of 350 μm, was mounted on the plating film 14 of the pre-substrate 2, and reflow was preformed once under a condition where a peak temperature was 169° C. and the time of maintaining the temperature at 139° C. or higher was 60 seconds. Thereby, a wiring substrate of Comparative Example 4 was obtained. Ten specimens of Comparative Example 4 were manufactured.

Comparative Example 4-1

A solder ball made of Sn-58 wt % Bi, with a diameter of 350 μm, was mounted on the plating film of the pre-substrate 3, and reflow was preformed five times under a condition where a peak temperature was 169° C. and the time of maintaining the temperature at 139° C. or higher was 60 seconds. Thereby, a wiring substrate of Comparative Example 4-1 was obtained. Ten specimens of Comparative Example 4-1 were manufactured.

Comparative Example 4-2

A solder ball made of Sn-58 wt % Bi, with a diameter of 350 μm, was mounted on the plating film of the pre-substrate 3, and reflow was preformed once under a condition where a peak temperature was 169° C. and the time of maintaining the temperature at 139° C. or higher was 60 seconds. Thereby, a wiring substrate of Comparative Example 4-2 was obtained. Ten specimens of Comparative Example 4-2 were manufactured.

Comparative Example 4-3

A solder ball made of Sn-57 wt % Bi-0.5 wt % Sb, with a diameter of 350 μm, was mounted on the plating film of the pre-substrate 3, and reflow was preformed five times under a condition where a peak temperature was 169° C. and the time of maintaining the temperature at 139° C. or higher was 60 seconds. Thereby, a wiring substrate of Comparative Example 4-3 was obtained. Ten specimens of Comparative Example 4-3 were manufactured.

Comparative Example 4-4

A solder ball made of Sn-57 wt % Bi-0.5 wt % Sb, with a diameter of 350 μm, was mounted on the plating film of the pre-substrate 3, and reflow was preformed once under a condition where a peak temperature was 169° C. and the time of maintaining the temperature at 139° C. or higher was 60 seconds. Thereby, a wiring substrate of Comparative Example 4-4 was obtained. Ten specimens of Comparative Example 4-4 were manufactured.

Example 5

A solder ball made of Sn-58 wt % Bi, with a diameter of 350 μm, was mounted on the plating film 14 of the pre-substrate 4, and reflow was preformed five times under a condition where a peak temperature was 169° C. and the time of maintaining the temperature at 139° C. or higher was 60 seconds. Thereby, a wiring substrate of Example 5 was obtained. Ten specimens of Example 5 were manufactured.

Comparative Example 5

A solder ball made of Sn-58 wt % Bi, with a diameter of 350 μm, was mounted on the plating film 14 of the pre-substrate 4, and reflow was preformed once under a condition where a peak temperature was 169° C. and the time of maintaining the temperature at 139° C. or higher was 60 seconds. Thereby, a wiring substrate of Comparative Example 5 was obtained. Ten specimens of Comparative Example 5 were manufactured.

Example 6

A solder ball made of Sn-57 wt % Bi-0.5 wt % Sb, with a diameter of 350 μm, was mounted on the plating film 14 of the pre-substrate 4, and reflow was preformed five times under a condition where a peak temperature was 169° C. and the time of maintaining the temperature at 139° C. or higher was 60 seconds. Thereby, a wiring substrate of Example 6 was obtained. Ten specimens of Example 6 were manufactured.

Comparative Example 6

A solder ball made of Sn-57 wt % Bi-0.5 wt % Sb, with a diameter of 350 μm, was mounted on the plating film 14 of the pre-substrate 4, and reflow was preformed once under a condition where a peak temperature was 169° C. and the time of maintaining the temperature at 139° C. or higher was 60 seconds. Thereby, a wiring substrate of Comparative Example 6 was obtained. Ten specimens of Comparative Example 6 were manufactured.

Example 7

A solder ball made of Sn-58 wt % Bi, with a diameter of 350 μm, was mounted on the plating film 14 of the pre-substrate 5, and reflow was preformed five times under a condition where a peak temperature was 169° C. and the time of maintaining the temperature at 139° C. or higher was 60 seconds. Thereby, a wiring substrate of Example 7 was obtained. Ten specimens of Example 7 were manufactured.

Comparative Example 7

A solder ball made of Sn-58 wt % Bi, with a diameter of 350 μm, was mounted on the plating film 14 of the pre-substrate 5, and reflow was preformed once under a condition where a peak temperature was 169° C. and the time of maintaining the temperature at 139° C. or higher was 60 seconds. Thereby, a wiring substrate of Comparative Example 7 was obtained. Ten specimens of Comparative Example 7 were manufactured.

Example 8

A solder ball made of Sn-57 wt % Bi-0.5 wt % Sb, with a diameter of 350 μm, was mounted on the plating film 14 of the pre-substrate 5, and reflow was preformed five times under a condition where a peak temperature was 169° C. and the time of maintaining the temperature at 139° C. or higher was 60 seconds. Thereby, a wiring substrate of Example 8 was obtained. Ten specimens of Example 8 were manufactured.

Comparative Example 8

A solder ball made of Sn-57 wt % Bi-0.5 wt % Sb, with a diameter of 350 μm, was mounted on the plating film 14 of the pre-substrate 5, and reflow was preformed once under a condition where a peak temperature was 169° C. and the time of maintaining the temperature at 139° C. or higher was 60 seconds. Thereby, a wiring substrate of Comparative Example 8 was obtained. Ten specimens of Comparative Example 8 were manufactured.

Example 9

A solder ball made of Sn-58 wt % Bi, with a diameter of 350 μm, was mounted on the plating film 14 of the pre-substrate 6, and reflow was preformed five times under a condition where a peak temperature was 169° C. and the time of maintaining the temperature at 139° C. or higher was 60 seconds. Thereby, a wiring substrate of Example 9 was obtained. Ten specimens of Example 9 were manufactured.

Comparative Example 9

A solder ball made of Sn-58 wt % Bi, with a diameter of 350 μm, was mounted on the plating film 14 of the pre-substrate 6, and reflow was preformed once under a condition where the peak temperature was 169° C. and the time of maintaining the temperature at 139° C. or higher was 60 seconds. Thereby, a wiring substrate of Comparative Example 9 was obtained. Ten specimens of Comparative Example 9 were manufactured.

Example 10

A solder ball made of Sn-57 wt % Bi-0.5 wt % Sb, with a diameter of 350 μm, was mounted on the plating film 14 of the pre-substrate 6, and reflow was preformed five times under a condition where a peak temperature was 169° C. and the time of maintaining the temperature at 139° C. or higher was 60 seconds. Thereby, a wiring substrate of Example 10 was obtained. 10 specimens of Example Ten were manufactured.

Comparative Example 10

A solder ball made of Sn-57 wt % Bi-0.5 wt % Sb, with a diameter of 350 m, was mounted on the plating film 14 of the pre-substrate 6, and reflow was preformed once under a condition where a peak temperature was 169° C. and the time of maintaining the temperature at 139° C. or higher was 60 seconds. Thereby, a wiring substrate of Comparative Example 10 was obtained. Ten specimens of Comparative Example 10 were manufactured.

Example 11

A solder ball made of Sn-58 wt % Bi, with a diameter of 350 μm, was mounted on the plating film 14 of the pre-substrate 1, and reflow was preformed once under a condition where a peak temperature was 169° C. and the time of maintaining the temperature at 139° C. or higher was 90 seconds. Thereby, a wiring substrate of Example 11 was obtained. Ten specimens of Example 11 were manufactured.

Example 12

A solder ball made of Sn-57 wt % Bi-0.5 wt % Sb, with a diameter of 350 μm, was mounted on the plating film 14 of the pre-substrate 1, and reflow was preformed once under a condition where a peak temperature was 169° C. and the time of maintaining the temperature at 139° C. or higher was 90 seconds. Thereby, a wiring substrate of Example 12 was obtained. Ten specimens of Example 12 were manufactured.

(Evaluation Method)

With respect to the specimens of Examples 1 to 4, Comparative Examples 1 to 4, and Comparative Examples 4-1 to 4-4, slow shear testing was performed using a bonding tester (Model: PTR-1102, manufactured by Rhesca Corporation), to evaluate the reliability of solder mounting with solder failure modes. Failure modes indicate that with respect to the area in the plane of the electrode 12, the remaining amount of solder that is 70% or larger is a solder failure mode, that 30 to 70% is a solder+IMC failure mode, and that 30% or smaller is an IMC failure mode. As the rate of solder failure mode is higher, the reliability of solder mounting is better.

With respect to the specimens of Examples 5 to 12 and Comparative Examples 5 to 10, the reliability of solder mounting was evaluated with bonding strength during the slow shear test, because a difference in the rate of solder failure modes was not recognizable in the slow shear test performed according to the above-described manner.

(Evaluation Results)

The evaluation results on Examples 1 to 4, Comparative Examples 1 to 4, and Comparative Examples 4-1 to 4-4 is shown in Table 1. Also, the bonding strength during the slow shear test is shown.

TABLE 1

| | Specimen | | | | Evaluation results of reliability of solder mounting | | | |
|---|---|---|---|---|---|---|---|---|
| | | | | Time of | Rate of each failure mode (%) | | | |
| | Type of plating film | Type of solder | Number of reflow | maintaining 139° C. or higher (s) | Solder failure | Solder + IMC failure | IMC failure | Bonding strength (N) |
| Example 1 | Electroless Ni/Pd/Au | Sn—58wt%Bi | 5 | 300 | 40 | 60 | 0 | 4.854 |
| Comparative Example 1 | Electroless Ni/Pd/Au | Sn—58wt%Bi | 1 | 60 | 0 | 70 | 30 | 4.627 |
| Example 2 | Electroless Ni/Pd/Au | Sn—57wt%Bi—0.5wt%Sb | 5 | 300 | 80 | 20 | 0 | 4.826 |
| Comparative Example 2 | Electroless Ni/Pd/Au | Sn—57wt%Bi—0.5wt%Sb | 1 | 60 | 10 | 80 | 10 | 4.464 |
| Example 3 | Lead-free electroless Ni/Pd/Au | Sn—58wt%Bi | 5 | 300 | 70 | 30 | 0 | 5.117 |
| Comparative Example 3 | Lead-free electroless Ni/Pd/Au | Sn—58wt%Bi | 1 | 60 | 0 | 80 | 20 | 4.310 |
| Example 4 | Lead-free electroless Ni/Pd/Au | Sn—57wt%Bi—0.5wt%Sb | 5 | 300 | 70 | 30 | 0 | 4.846 |
| Comparative Example 4 | Lead-free electroless Ni/Pd/Au | Sn—57wt%Bi—0.5wt%Sb | 1 | 60 | 50 | 50 | 0 | 4.802 |
| Comparative Example 4-1 | Lead-free electroless Ni/Au | Sn—58wt%Bi | 5 | 300 | 20 | 80 | 0 | 4.961 |
| Comparative Example 4-2 | Lead-free electroless Ni/Au | Sn—58wt%Bi | 1 | 60 | 70 | 30 | 0 | 5.116 |
| Comparative Example 4-3 | Lead-free electroless Ni/Au | Sn—57wt%Bi—0.5wt%Sb | 5 | 300 | 30 | 70 | 0 | 4.888 |

TABLE 1-continued

| | Specimen | | | | Evaluation results of reliability of solder mounting | | | |
|---|---|---|---|---|---|---|---|---|
| | | | | Time of | Rate of each failure mode (%) | | | |
| | Type of plating film | Type of solder | Number of reflow | maintaining 139° C. or higher (s) | Solder failure | Solder + IMC failure | IMC failure | Bonding strength (N) |
| Comparative Example 4-4 | Lead-free electroless Ni/Au | Sn—57wt%Bi—0.5wt%Sb | 1 | 60 | 60 | 40 | 0 | 5.059 |

As shown in Table 1, when using the plating film of multilayer structure including the electroless Ni/Pd/Au plating, the specimens after 5 reflow treatments have higher rates of solder failure mode, and exhibit higher reliability of solder mounting compared with those of the Comparative Examples (where reflow was performed only once) corresponding to the each Example. The effect is also applied to the case where the Ni plating film 18 is a lead-free electroless Ni plating film, as shown in Examples 3 to 4 and Comparative Examples 3 to 4.

According to Comparative Examples 4-1 to 4-4 using the plating film of multilayer structure consisting of the lead-free electroless Ni/Au, the rate of solder failure mode is lowered down to 30% or lower after 5 times reflow. Thus, low reliability of solder mounting is observed.

From the above, it is demonstrated that in the wiring substrate of the present exemplary embodiment using the plating film including the Pd plating film, high reliability of solder mounting can be achieved after repeated reflow. The present exemplary embodiment is applicable to the use where reflow resistance is required.

Figure 4:
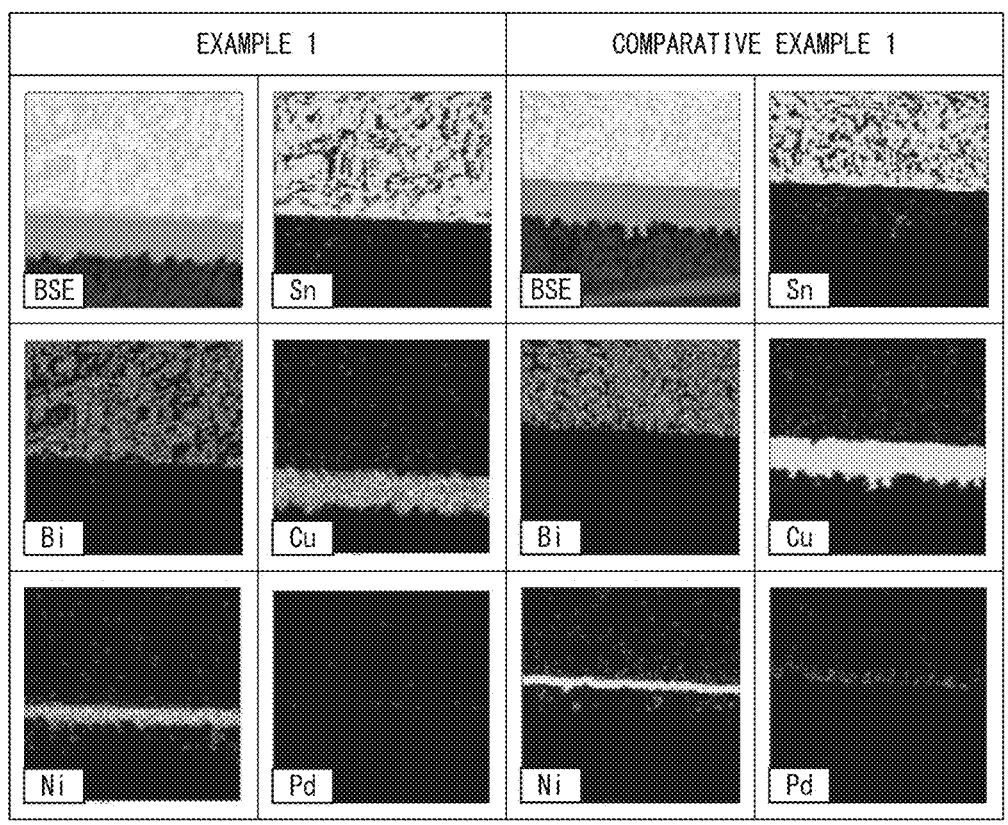
FIG. 4 shows images of element mapping of each element of the portion between the electrode and the solder after solder mounting and reflected electron images thereof, in wiring substrates of Examples of the present invention and Comparative Examples.

FIG. 4 shows images of element mapping of bonding sections in the wiring substrates of Example 1 and Comparative Example 1 where Sn-58 wt % Bi solder is mounted. As seen from the left images in FIG. 4, in the wiring substrate of Example 1, no Pd concentrated layer between the electrode and the solder is recognized, whereas in the wiring substrate of Comparative Example 1, in the right images in FIG. 4, Pd is distributed in the form of a layer, and a Pd concentrated layer is recognized. From the presence or absence of a Pd concentrated layer and the evaluation results of the reliability of solder mounting, it is demonstrated that the reliability of solder mounting is improved by having Pd dissolved uniformly in a solder bulk, in a solder bonding process.

Next, evaluation results of Examples 5 to 12 and Comparative Examples 5 to 10 is shown in Table 2.

TABLE 2

| | Specimen | | | | Evaluation results of reliability of solder mounting |
|---|---|---|---|---|---|
| | Type of plating film | Type of solder | Number of reflow | Time of maintaining 139° C. or higher (s) | Bonding strength (N) |
| Example 5 | Electroless Pd/Au | Sn—58 wt % Bi | 5 | 300 | 5.410 |
| Comparative Example 5 | Electroless Pd/Au | Sn—58 wt % Bi | 1 | 60 | 3.570 |
| Example 6 | Electroless Pd/Au | Sn—57 wt % Bi—0.5 wt % Sb | 5 | 300 | 4.902 |
| Comparative Example 6 | Electroless Pd/Au | Sn—57 wt % Bi—0.5 wt % Sb | 1 | 60 | 3.374 |
| Example 7 | Electroless Pd | Sn—58 wt % Bi | 5 | 300 | 4.681 |
| Comparative Example 7 | Electroless Pd | Sn—58 wt % Bi | 1 | 60 | 4.272 |
| Example 8 | Electroless Pd | Sn—57 wt % Bi—0.5 wt % Sb | 5 | 300 | 4.969 |
| Comparative Example 8 | Electroless Pd | Sn—57 wt % Bi—0.5 wt % Sb | 1 | 60 | 4.275 |
| Example 9 | Electrolytic Ni/Pd/Au | Sn—58 wt % Bi | 5 | 300 | 5.270 |
| Comparative Example 9 | Electrolytic Ni/Pd/Au | Sn—58 wt % Bi | 1 | 60 | 4.712 |
| Example 10 | Electrolytic Ni/Pd/Au | Sn—57 wt % Bi—0.5 wt % Sb | 5 | 300 | 4.983 |
| Comparative Example 10 | Electrolytic Ni/Pd/Au | Sn—57 wt % Bi—0.5 wt % Sb | 1 | 60 | 4.414 |
| Example 11 | Electroless Ni/Pd/Au | Sn—58 wt % Bi | 1 | 90 | 5.599 |
| Example 12 | Electroless Ni/Pd/Au | Sn—57 wt % Bi—0.5 wt % Sb | 1 | 90 | 5.522 |

As seen from Table 2, when using the plating film of multilayer structure consisting of electroless Pd/Au plating, the plating film of single layer consisting of electroless Pd plating, and the plating film of multilayer structure consisting of electrolytic Ni/Pd/Au, the specimens after 5 times reflow have higher solder bonding, and exhibit higher reliability of solder mounting compared with Comparative Examples corresponding to the each Example. Also, as shown in Examples 11 to 12, in the case where the time of maintaining the temperature at 139° C. or higher is set to 90 seconds, even though reflow is performed only once, the increase in bonding strength is recognized compared with Comparative Examples 1 and 2.

Also, from the results of Examples 3 to 4, Comparative Examples 3 to 4, Examples 9 to 10, and Comparative Examples 9 to 10, the increase in bonding strength after 5 times reflow is recognized, irrespective of whether the type of Ni plating film is a lead-free Ni plating film or an electrolytic Ni plating film.

The foregoing exemplary embodiments and Examples of the present invention are described but the technical scope of present invention is not limited to the exemplary embodiments. Various changes of combinations of elements can be made or modifications to each element can be added or deleted, without departing from the idea of the invention.

What is claimed is:

1. A method for manufacturing a wiring substrate comprising:
   forming a plating film comprising a film comprising at least Pd on an electrode comprising Cu or a Cu alloy;
   forming a solder resist layer protecting a portion of the electrode outside of a bonding site of a solder, the solder resist fully covering all side surfaces of the electrode; and
   bonding, onto the plating film, the solder having a melting point of lower than 140° C. onto the plating film by heating, to uniformly dissolve the Pd in the solder and remove the Pd from the plating film, the bonding the solder onto the plating film by heating being performed under one of the following predetermined thermal conditions:
   (1) reflow treatment at a time of bonding the solder is performed one to five times under a condition where a peak temperature is 139° C. or higher and 169° C. or lower, a time of maintaining a temperature at 139° C. or higher and 169° C. or lower is shorter than 90 seconds, and a total time of heating treatment including reflow is 300 seconds or shorter,
   (2) after bonding the solder, a heating treatment of maintaining the temperature at 139° C. or higher and 169° C. or lower for 90 seconds or longer is performed, and
   (3) reflow treatment at the time of bonding the solder is performed one to five times under a condition where a peak temperature is 139° C. or higher and 169° C. or lower, a total time of heating treatment including reflow is 300 seconds or shorter, and the time of maintaining the temperature at 139° C. or higher and 169° C. or lower is 90 seconds or longer.

2. The method for manufacturing a wiring substrate according to claim 1,
   wherein when the plating film is formed, a thickness of the film comprising Pd is 0.01 μm or more and 5 μm or less.

* * * * *

UNITED STATES PATENT AND TRADEMARK OFFICE
CERTIFICATE OF CORRECTION

PATENT NO. : 9,883,586 B2
APPLICATION NO. : 14/808275
DATED : January 30, 2018
INVENTOR(S) : Tetsuyuki Tsuchida et al.

It is certified that error appears in the above-identified patent and that said Letters Patent is hereby corrected as shown below:

In the Claims

Column 20, Line 21:
In Claim 1, delete "90seconds" and insert -- 90 seconds --, therefore.

Signed and Sealed this
Twenty-fourth Day of April, 2018

Andrei Iancu
*Director of the United States Patent and Trademark Office*